United States Patent [19]
Nemoto et al.

[11] Patent Number: 5,525,457
[45] Date of Patent: Jun. 11, 1996

[54] REFLECTION PREVENTING FILM AND PROCESS FOR FORMING RESIST PATTERN USING THE SAME

[75] Inventors: Hiroaki Nemoto; Masayuki Endo, both of Yokohama; Yoshiji Yumoto; Takao Miura, both of Yokkaichi, all of Japan

[73] Assignee: Japan Synthetic Rubber Co., Ltd., Tokyo, Japan

[21] Appl. No.: 354,847

[22] Filed: Dec. 9, 1994

[51] Int. Cl.$^6$ ............... G03F 7/26; G03F 7/09
[52] U.S. Cl. ............ 430/325; 430/326; 430/327; 430/330; 430/510; 526/266; 526/273; 526/317.1; 526/318.5; 526/318.6
[58] Field of Search ................ 430/169, 510, 430/325, 326, 327, 330; 526/266, 273, 318.5, 318.6, 317.1

[56] References Cited

U.S. PATENT DOCUMENTS

| | | | |
|---|---|---|---|
| 5,085,975 | 2/1992 | Mueller | 430/285 |
| 5,397,684 | 3/1995 | Hogan et al. | 430/313 |
| 5,401,614 | 3/1995 | Dichiara et al. | 430/323 |
| 5,410,005 | 4/1995 | Nemoto et al. | 526/245 |

FOREIGN PATENT DOCUMENTS

| | | |
|---|---|---|
| 0040841 | 12/1981 | European Pat. Off. . |
| 0118656 | 4/1994 | Japan . |

*Primary Examiner*—Charles L. Bowers, Jr.
*Assistant Examiner*—Christopher G. Young
*Attorney, Agent, or Firm*—Oblon, Spivak, McClelland, Maier & Neustadt

[57] ABSTRACT

A reflection preventing film for forming a resist pattern and a process for forming the resist pattern using the film. The film comprises a copolymer was copolymerized of monomers which comprise at least one unsaturated carboxylic acid monomer, at least one epoxy group-containing unsaturated monomer, and at least one cinnamoylphenyl group-containing unsaturated monomer. The reflection preventing film exhibits a high halation preventing effect, involves no sublimation of radiation absorbing components contained therein, is free from occurrence of intermixing, possesses excellent heat resistance, exhibits a superb dry etching performance and storage stability, and produces resist patterns with excellent resolution and precision. The resist pattern forming process comprises forming the reflection preventing film on a substrate, forming a resist coating film on said reflection preventing film, irradiating the resist film with a radiation, and developing the resist coating film.

10 Claims, No Drawings

REFLECTION PREVENTING FILM AND PROCESS FOR FORMING RESIST PATTERN USING THE SAME

BACKGROUND OF THE INVENTION

1. Field of the Invention

The present invention relates to a reflection preventing film which is useful for microprocessing in lithographic processes using various radiations, and to a process for forming a resist pattern using the reflection preventing film.

2. Description of the Background Art

In the filed of production of integrated circuits, a lithographic process which enables fine processing in an order of sub-half micron is now being developed in order to obtain a higher degree of integration.

In this lithographic process, a desired pattern is obtained by coating a resist such as a positive resist consisting of a novolak resin and a quinonediazide sensitizer usually in a thickness of 0.5–10 μm on a substrate, transferring the master pattern thereto using a stepper, and then developing the same with a suitable developing solution.

However, due to halation caused by reflection of the incident radiation on the surfaces of highly reflective substrates, such as aluminum or aluminum alloys (e.g., aluminum-silicon alloy, aluminum-silicon-copper alloy), polysilicon, and tungsten silicide, used in this process, or even on the surfaces of other materials such as silicon which are used depending on the wavelength of radiation (e.g., deep ultraviolet rays), the radiation reaches the region which should not be irradiated. This prevents precise reproduction of fine patterns. A conventional method for preventing reflection on the surfaces of substrates has been adding a radiation absorber, such as a dye, to the positive resist to reduce transmittance of radiations of the resist.

The method of adding a radiation absorber, however, does not allow radiations to reach sufficiently deep in the resist coating film. This can be the cause of problems such as impaired resist pattern configurations, decrease in the sensitivity, resolution degree, depth of focus or the like, and reduced resist storage stability. The resist performance is lowered, resulting in impaired development and resolution performance.

Another method proposed for preventing the halation is forming a reflection preventing film on the surfaces of highly reflective substrate to absorb the incident radiation. Inorganic films such as coating layers of titanium, titanium dioxide, titanium nitride, chromium oxide, carbon, and α-silicon, formed by vacuum deposition, CVD, spattering, or the like, are known as such a reflection preventing film. These inorganic reflection preventing films have problems in their applicability to integrated circuits because of their conductivity and in the requirement of special devices for vacuum deposition, CVD, or spattering, when they are formed.

In an attempt for overcoming these problems in the inorganic reflection preventing films, an organic reflection preventing film comprising a polyamine acid (co)polymer or sulfone (co)polymer and a dye has been proposed (for example, Japanese Patent Application Laid-open (kokai) No. 93448/1984). This reflection preventing film is not conductive and can be applied to substrates by the same method as the method of resist application by dissolving it in a suitable solvent without requiring a special device.

However, this reflection preventing film comprising a polyamine acid (co)polymer or sulfone (co)polymer and a dye has the following problems. (i) Halation cannot be prevented sufficiently because of a limitation to the amount of dyes to be added. (ii) Halation preventing effects are unduly decreased and the equipment is contaminated due to sublimation of a portion of dyes from the reflection preventing film during baking and dry etching operation. (iii) Resist resolution and development performance are impaired due to intermixing (a phenomenon that a slight amount of the components of the reflection preventing film is mixed with the resist). (iv) Deformation of resist patterns during the baking and dry etching operation after irradiation due to poor heat resistance of the reflection preventing film. (v) Resist patterns may be damaged or cannot be precisely transferred to the reflection preventing film by the dry etching method after development, because the etching speed of the reflection preventing film is equivalent to or less than that of the resist.

An object of the present invention is therefore to provide a reflection preventing film, exhibiting a high halation preventing effect, involving no sublimation of radiation absorbing components contained therein, free from occurrence of intermixing, possessing excellent heat resistance, exhibiting a superb dry etching performance and storage stability, and producing resist patterns with excellent resolution capability and precision, as well as a process for forming resist patterns.

SUMMARY OF THE INVENTION

The above object can be solved according to the present invention by a reflection preventing film which comprises a copolymer comprising, at least one recurring unit of the following formula (1),

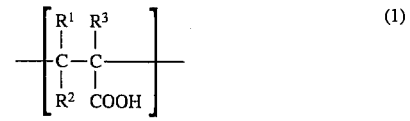

wherein $R^1$, $R^2$, and $R^3$ may be the same or different and individually represent a hydrogen atom or an organic group;

at least one recurring unit of the following formula (2),

wherein $R^1$, $R^2$, and $R^3$ may be the same or different and individually represent a hydrogen atom or an organic group, and $R^4$ is an organic group containing an epoxy group; and at least one recurring unit of the following formula (3),

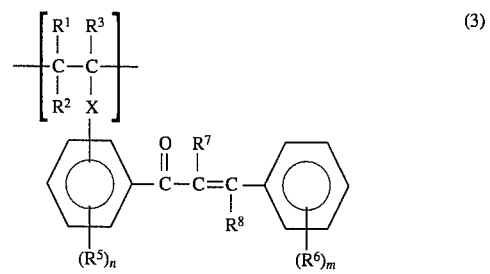

wherein $R^1$, $R^2$, and $R^3$ may be the same or different and individually represent a hydrogen atom or an organic group, X represents a divalent group or a single bond, $R^5$ and $R^6$ may be the same or different and individually represent a hydrogen atom, a halogen atom, a hydroxy group, an amino group, a nitro group, or an organic group, $R^7$ and $R^8$ may be the same or different and individually represent a hydrogen atom, a halogen atom, an amino group, or an organic group, n is an integer of 1–4, and m is an integer of 1–5.

The above object can be further solved according to the present invention by a process for forming a resist pattern which comprises forming a reflection preventing film on a substrate, coating a resist on said reflection preventing film to form a resist coating film, irradiating the resist coating film with a radiation in a desired pattern form, and developing the resist coating film to form a resist pattern.

These and other objects, features, and advantages of the present invention will become more apparent from the following description of the preferred embodiments.

DETAILED DESCRIPTION OF THE INVENTION AND PREFERRED EMBODIMENTS

The copolymer from which the reflection preventing film of the present invention is produced can be prepared by copolymerizing at least one monomer corresponding to the recurring unit represented by the above formula (1) (such a monomer is hereinafter referred to as unsaturated carboxylic acid monomer), at least one monomer corresponding to the recurring unit represented by the above formula (2) (such a monomer is hereinafter referred to as epoxy group-containing unsaturated monomer), and at least one monomer corresponding to the recurring unit represented by the above formula (3) (such a monomer is hereinafter referred to as cinnamoylphenyl group-containing unsaturated monomer).

Given as examples of organic groups represented by $R^1$, $R^2$, and $R^3$ in the above formula (1) are alkyl groups having, preferably, 1–10 carbon atoms such as methyl, ethyl, and the like; carboxyl group; carboxyl alkyl groups having, preferably, 2–10 carbon atoms such as carboxyl methyl, carboxyl ethyl, carboxyl propyl, and the like; alkoxycarbonyl groups having, preferably, 2–10 carbon atoms such as methoxycarbonyl, ethoxycarbonyl, and the like; acyloxy groups having, preferably, 2–10 carbon atoms such as acetyloxy, propionyloxy, benzoyloxy, and the like; aryl groups having, preferably, 6–10 carbon atoms such as phenyl, cumenyl, and the like; aralkyl groups having, preferably, 7–12 carbon atoms such as benzyl and the like; alkoxy groups having preferably 1–10 carbon atoms such as methoxy, ethoxy, and the like; cyclic alkyl groups having, preferably, 3–10 carbon atoms such as cyclohexyl and the like; cyano groups; and amide groups (e.g. carbamoyl groups).

The unsaturated carboxylic acid monomers of formula (1) include, for example, unsaturated monocarboxylic acids, such as (meth)acrylic acid, crotonic acid, cinnamic acid, atropic acid, 3-acetyloxy(meth)acrylic acid, 3-benzoyloxy(meth)acrylic acid, α-benzylacrylic acid, α-methoxyacrylic acid, and 3-cyclohexyl(meth)acrylic acid; unsaturated polycarboxylic acids, such as fumaric acid, maleic acid, citraconic acid, mesaconic acid, and itaconic acid; esters containing free carboxyl group, such as monomethyl ester, monoethyl ester, mono-n-propyl ester, or mono-n-butyl ester of said unsaturated polycarboxylic acids; nitrile derivatives containing free carboxyl group of said unsaturated polycarboxylic acids; amide (carbamoyl) derivatives containing free carboxyl group of said unsaturated polycarboxylic acids.

Specific examples of preferable unsaturated carboxylic acid monomers are methacrylic acid and acrylic acid.

These unsaturated carboxylic acid monomers can be used either alone or as a mixture of two or more depending on the characteristics desired for the reflection preventing films.

In the formula (2), the same groups as mentioned for the formula (1) can be given as examples of organic groups represented by $R^1$, $R^2$, and $R^3$. Included in the examples of epoxy group-containing organic groups represented by $R^4$ are epoxy group-containing alkyl groups having, preferably, 2–10 carbon atoms such as epoxy ethyl, glycidyl, and the like; epoxy group-containing ether groups consisting of said epoxy group-containing alkyl group bonded to a carbon atom in the main chain constructing said recurring unit of formula (2) via —O— or —$OR^9$—, wherein $R^9$ is an alkylene group such as methylene or ethylene (e.g. ether groups containing epoxy group having, preferably, 2–10 carbon atoms); and epoxy group-containing ester groups consisting of said epoxy group-containing alkyl group bonded to a carbon atom in the main chain constructing said recurring unit of formula (2) via —COO— or —$COOR^9$—, wherein $R^9$ is an alkylene group such as methylene or ethylene (e.g. ester groups containing epoxy group having, preferably, 3–10 carbon atoms).

Given as specific examples of epoxy group-containing unsaturated monomers are 3,4-epoxy-1-butene, 3,4-epoxy-2-methylbutene, vinyl glycidyl ether, allyl glycidyl ether, glycidyl (meth)acrylate, vinyl ethers of hydroxyethyl (meth)acrylate, and glycidyl ethers of hydroxyethyl (meth)acrylate. Of these, glycidyl methacrylate and glycidyl acrylate are especially preferred.

These epoxy group-containing unsaturated monomers can be used either alone or as a mixture of two or more depending on the characteristics desired for the reflection preventing films.

In the formula (3), the same groups as mentioned for the formula (1) can be given as examples of organic groups represented by $R^1$, $R^2$, and $R^3$. As examples of divalent groups represented by X, groups —COO—, —$COOR^9$—, —O—, and —$OR^9$—, wherein $R^9$ is an alkylene group such as methylene or ethylene, can be given. Included in organic groups represented by $R^5$ or $R^6$, besides groups given for $R^1$, $R^2$, and $R^3$, are alkenyl groups, cyclic alkyloxy groups, and the like The same groups named for $R^1$, $R^2$, and $R^3$ are given as examples for $R^7$ or $R^8$.

The following compounds are given as specific examples of the cinnamoylphenyl group-containing unsaturated monomers: (meth)acrylates of cinnamoylphenol such as,
4'-cinnamoylphenol, 4'-(4-hydroxycinnamoyl)phenol,
4'-(4-methylcinnamoyl)phenol,
4'-(3,4-dimethylcinnamoyl)phenol,
4'-(3-methoxy-4-methylcinnamoyl)phenol,
4'-(4-ethylcinnamoyl)phenol,
4'-(4-isopropylcinnamoyl)phenol,
4'-(4-methoxycinnamoyl)phenol,
4'-(2-methoxycinnamoyl)phenol,
2'-(4-methoxycinnamoyl)phenol,
4'-(3,4-dimethoxycinnamoyl)phenol,
4'-(3,4,5-trimethoxycinnamoyl)phenol,
4'-(4-nitrocinnamoyl)phenol,
4'-(4-nitro-3-chlorocinnamoyl)phenol,
4'-(α-chloro-4-aminocinnamoyl)phenol,
4'-(α-cyano-β-allyl-3,4-dimethoxycinnamoyl)phenol,
4'-(β-isopropenyl-3,4,5-trimethoxycinnamoyl)phenol,
4'-(2-nitro-3-benzyl-4-methoxycinnamoyl)phenol,
4'-(2-nitrocinnamoyl)phenol,
4'-(3-methyl-4-nitrocinnamoyl)phenol,
4'-(4-methoxycinnamoyl)-4'-methoxyphenol, 4'-(3,4-dioxolenylcinnamoyl)phenol,
4'-(4-methoxy-α-cyanocinnamoyl)phenol,
4'-(α-cyano-4-aminocinnamoyl)phenol,
4'-(α-cyano-4-(N,N-dimethylamino)cinnamoyl)phenol,
4'-(α-cyano-4-morpholinocinnamoyl)phenol,
4'-(3-methyl-4-methoxycinnamoyl)phenol,
4'-(α-cyano-3-methyl-4-methoxycinnamoyl)phenol,
4'-(3,4-dimethoxycinnamoyl)-2'-nitrophenol,
2'-methoxy-4'-(α-cyano-4-aminocinnamoyl)phenol, and the like;

ethers of these cinnamoylphenols and hydroxyethyl (meth)acrylates;

vinyl ethers of these cinnamoylphenols;

(meth)allyl ethers of these cinnamoylphenols;

4'-cinnamoylstyrene,
4'-(4-hydroxycinnamoyl)styrene,
4'-(4-methylcinnamoyl)styrene,
4'-(3,4-dimethylcinnamoyl)styrene,
4'-(3-methoxy-4-methylcinnamoyl)styrene,
4'-(4-ethylcinnamoyl)styrene,
4'-(4-isopropylcinnamoyl)styrene,
4'-(4-methoxycinnamoyl)styrene,
4'-(2-methoxycinnamoyl)styrene,
4'-(4-methoxycinnamoyl)styrene,
2'-(3,4-dimethoxycinnamoyl)styrene,
4'-(3,4,5-trimethoxycinnamoyl)styrene,
4'-(4-nitrocinnamoyl)styrene,
4'-(4-nitro-3-chlorocinnamoyl)styrene,
4'-(α-chloro-4-aminocinnamoyl)styrene,
4'-(α-cyano-β-allyl-3,4-dimethoxycinnamoyl)styrene,
4'-(β-isopropenyl-3,4,5-trimethoxycinnamoyl)styrene,
4'-(2-nitro-3-benzyl-4-methoxycinnamoyl)styrene,
4'-(2-nitrocinnamoyl)styrene,
4'-(3-methyl-4-nitrocinnamoyl)styrene,
2'-(4-methoxycinnamoyl)-4'-methoxystyrene,
4'-(3,4-dioxolenylcinnamoyl)styrene,
4'-(α-cyano-4-aminocinnamoyl)styrene,
4'-(α-cyano-4-(N,N-dimethylamino)cinnamoyl)styrene,
4'-(α-cyano-4-morpholinocinnamoyl)styrene,
4'-(3-methyl-4-methoxycinnamoyl)styrene,
4'-(α-cyano-3-methyl-4-methoxycinnamoyl)styrene,
4'-(3,4-dimethoxycinnamoyl)-2'-nitrostyrene,
2'-methoxy-4'-(α-cyano-4-aminocinnamoyl)styrene, and the like.

Of these, especially preferred compounds are
4'-(3-methyl-4-methoxycinnamoyl)phenyl acrylate,
4'-(4-methoxy-α-cyanocinnamoyl)phenyl methacrylate,
4'-(4-methylcinnamoyl)phenyl acrylate,
4'-(4-methylcinnamoyl)phenyl methacrylate, and
4'-(4-methoxycinnamoyl)phenyl methacrylate, These cinnamoylphenyl group-containing unsaturated monomers can be used either alone or as a mixture of two or more depending on the characteristics desired for the reflection preventing films.

Regarding the proportion of monomers to be copolymerized for preparing the reflection preventing film of the present invention, the unsaturated carboxylic acid monomers are used in an amount of 2–50 mol %, preferably 5–45 mol %, and particularly preferably 10–40 mol %; epoxy group-containing unsaturated monomers are used in an amount of 5–60 mol %, preferably 10–50 mol %, and particularly preferably 15–45 mol %; and cinnamoylphenyl group-containing unsaturated monomers are used in an amount of 2–60 mol %, preferably 5–50 mol %, and particularly preferably 10–45 mol %. If the amount of unsaturated carboxylic acid monomers is less than 2 mol %, there are risks for intermixing to occur due to insufficient curing by baking. If it is more than 50 mol %, the storage stability of the copolymer tends to be decreased. If the amount of the epoxy group-containing unsaturated monomers is less than 5 mol %, there are risks for intermixing to occur due to insufficient curing by baking. If it is more than 60 mol %, the storage stability of the copolymer tends to be decreased. If the amount of the cinnamoylphenyl group-containing unsaturated monomers is less than 2 mol %, halation preventing effects may be insufficient; if it is more than 60 mol %, the storage stability and coatability of the copolymer tend to be decreased.

Besides the unsaturated carboxylic acid monomers, epoxy group-containing unsaturated monomers and cinnamoylphenyl group-containing unsaturated monomers, unsaturated monomers with a bulky group can be incorporated for preparing the copolymer used for the reflection preventing film of the present invention. Such an addition improves the storage stability of the copolymer even more.

Included in examples of such unsaturated monomers with a bulky group are styrene, α-methylstyrene, 4-methylstyrene, 2-hydroxystyrene, 4-hydroxystyrene, 4-t-butylstyrene, chloromethylstyrene, divinylbenzene, dimethylvinylstyrylsilane, isopropenylstyrene, 1-vinylnaphthalene, 2-vinylnaphthalene, 9-vinylanthracene, 9-vinylcarbazole, vinylcyclohexene, ethylidenenorbornene, cyclopentadiene, tert-butyl (meth)acrylate, cyclohexyl (meth)acrylate, adamantyl (meth)acrylate, 1-naphthyl(meth)acrylate, 2-naphthyl (meth)acrylate, dicyclopentanyl (meth)acrylate, dicyclopentadienyl (meth)acrylate, tricyclodecenyl (meth)acrylate [e.g. dihydrodicyclopentadienyl (meth)acrylate], tricyclodecenyloxyethyl (meth)acrylate [e.g. dihydrodicyclopentadienyloxyethyl (meth)acrylate], tricyclodecanyl (meth)acrylate, 2-methacryloyloxyethyl phthalate, 2-methacryloyloxyethyl hexahydrophthalate, and the like.

Cyclohexyl methacrylate, dicyclopentadienyl methacrylate, tert-butyl methacrylate, and tricyclodecanyl methacrylate are particularly preferred.

These unsaturated monomers with a bulky group can be used either alone or as a mixture of two or more of them.

The proportion of the unsaturated monomers with a bulky group to be copolymerized is less than 50 mol %, preferably 10–40 mol %, and particularly preferably 15–35 mol %. If this copolymerization proportion exceeds 50 mol %, not only intermixing may occur due to insufficient curing by baking, but also the coatability may be impaired.

Furthermore, unsaturated monomers other than those mentioned above may be copolymerized for producing the copolymer for the reflection preventing film of the present invention for the purpose of improving storage stability, thermosetting ability, coatability, dry-etching ability, and the like. Included in examples of such monomers are vinyl esters of carboxylic acid, such as vinyl acetate, vinyl propionate, and vinyl capronate; cyanated vinyl compounds, such as (meth)acrylonitrile and α-chloroacrylonitrile; esters of unsaturated carboxylic acid, such as methyl (meth)acrylate, ethyl (meth)acrylate, n-propyl (meth)acrylate, n-butyl (meth)acrylate, and n-hexyl (meth)acrylate; olefins, such as ethylene and propylene; halogenated olefins, such as vinyl chloride, vinylidene chloride, vinylidene fluoride, tetrafluoroethylene, and hexafluoropropylene; dienes, such as butadiene, isoprene, chloroprene, piperylene, 2,3-dimethylbutadiene, and methylpentadiene; unsaturated group-containing unsaturated carboxylic acid esters, such as ethylene glycol di(meth)acrylate, propylene glycol di(meth)acrylate, vinyl (meth)acrylate, and dimethylvinylmethacryloyloxymethylsilane; halogen-containing vinyl compounds, such as 2-chloroethyl vinyl ether, vinyl chloroacetate, and allyl chloroacetate; hydroxy group-containing vinyl compounds, such as 2-hydroxyethyl (meth)acrylate, 2-hydroxypropyl (meth)acrylate, N-methylol (meth)acrylamide, and (meth)allyl alcohol; amide group-containing vinyl compounds, such as (meth)acrylamide and crotonamide; carboxyl group-containing vinyl compounds, such as 2-methacryloyloxyethyl succinate and 2-methacryloyloxyethyl maleate; and the like.

Of these, n-hexyl methacrylate is particularly preferred.

These unsaturated monomers can be used either alone or as a mixture of two or more of them, at a copolymerization proportion of less than 30 mol %, and preferably less than 20 mol %.

Copolymers composing the reflection preventing film of the present invention can be prepared by radical copolymerization, anionic copolymerization, cationic copolymerization, coordination copolymerization, or the like using a copolymerization method such as bulk polymerization, suspension polymerization, bulk-suspension polymerization, emulsion polymerization, solution polymerization, precipitation polymerization, or the like.

This copolymer may have various structures, such as random copolymer, block copolymer, graft copolymer, or the like. In the case of the block copolymer, each polymer block may consists only of one of the unsaturated carboxylic acid monomers, epoxy group-containing unsaturated monomers, or cinnamoylphenyl group-containing unsaturated monomers, or may consists of two or more of these unsaturated monomers. In the case of the graft copolymer, each backborne polymer chain or graft polymer chain may consists only of one of the unsaturated carboxylic acid monomers, epoxy group-containing unsaturated monomers, or cinnamoylphenyl group-containing unsaturated monomers, or may consists of two or more of these unsaturated monomers.

When the copolymer composing the reflection preventing film of the present invention contains unsaturated carbon-carbon bonds, the copolymer can be used after hydrogenation.

The polystyrene-reduced weight average molecular weight (hereinafter referred to as Mw) of the copolymer composing the reflection preventing film of the present invention may be appropriately varied depending on the desired characteristics of the reflection preventing film, and is preferably 3,000–1,000,000, more preferably 4,000–700,000, and particularly preferably 5,000–500,000. If Mw is smaller than 3,000, the coatability and film-forming ability required for forming the reflection preventing film tends to decrease; if it is greater than 1,000,000, there may be the case where solubility in solvents, coatability, storage stability, and the like are lowered depending on the kinds of monomers, copolymerization proportions, and the like.

Although the reflection preventing film of the present invention is a composition comprising a copolymer which comprises at least one recurring unit selected from the recurring units represented by formula (1), formula (2), or formula (3), it may comprise unreacted monomers containing these recurring units represented by formula (1), formula (2), or formula (3). Furthermore, a polymerization solution obtained by the polymerization of these monomers, which contains both the copolymers and monomers, can be used as the reflection preventing film of the present invention. In addition, various additives can be incorporated in the reflection preventing film to the extent that the effects intended by the present invention are not affected.

Surfactants, radiation absorbers, and the like can be given as such additives.

The surfactants have an action of improving coatability, striation, wettability, developability, and the like. Included in the examples of such surfactants are nonionic surfactants, such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, and polyethylene glycol distearate; and commercially available surfactants, such as KP 341 (organosiloxane polymer: a trademark, manufactured by Shin-Etsu Chemical Co., Ltd.), Polyflow No. 75 and No. 95 ((meth)acrylic acid copolymer: trademarks, manufactured by Kyoeisha Chemical Co., Ltd.), FFTOP EF-301, EF-303, EF-352, EF-101, EF-204 (trademarks, manufactured by TOHKEM PRODUCT Co.), Megafac F171, F172 and F173 (trademarks, manufactured by DAINIPPON INK & CHEMICALS), Fluorad FC430 FC431, FC135, FC93 (trademarks, manufactured by Sumitomo 3M), Asahi Guard AG710, SURFLON S-382, SURFLON SC-101, SC-102, SC-103, SC-104, SC-105, SC-106 (trademarks, manufactured by Asahi Glass), and the like.

The amount of these surfactants to be incorporated is usually 15 parts by weight or smaller, preferably 10 parts by weight or smaller, for 100 parts by weight of solid components of the reflection preventing film.

The radiation absorbers has an action of further improving the halation preventing effect. Given as examples of such radiation absorbers are oil-soluble dyes, dispersion dyes, or basic dyes, such as 1,7-bis(4-hydroxyphenyl)-1,6-heptadiene-3,5-dione, 1-(4-hydroxyphenyl)-7-(3-methoxy-4-hydroxyphenyl)-1,6-heptadiene-3,5-dione, 1,7-bis(3-methoxy-4-hydroxyphenyl)-1,6-heptadiene-3,5-dione, 1,7-bis(2,4-dihydroxyphenyl)-1,6-heptadiene-3,5-dione, 1,7-bis(2,3,4-trihydroxyphenyl)-1,6-heptadiene-3,5-dione, 1-(4-hydroxyphenyl)-7-(2,3,4-trihydroxyphenyl)-1,6-heptadiene-3,5-dione, 1,7-bis(3-methoxy-4-hydroxyphenyl)-4,4-dimethyl-1,6-heptadiene-3,5-dione, 1,7-bis(3-methoxy-4-hydroxyphenyl)-4,4-diethyl-1,6-heptadiene-3,5-dione, 1,7-bis(3-methoxy-4-hydroxyphenyl)-1,2,6,7-tetramethyl-1,6-heptadiene-3,5-dione, 1,7-bis(3-methoxy-4-hydroxyphenyl)-1,2,4,4',6,7-hexamethyl-1,6-heptadiene-3,5-dione, 1,7-bis(3-ethoxy-4-hydroxyphenyl)-1,6-heptadiene-3,5-dione, 1,7-bis(3-butoxy-4-hydroxyphenyl)-1,6-heptadiene-3,5-dione, 1-(3-methyl-4-hydroxyphenyl)-7-(3-methoxy-4-hydroxyphenyl)-1,6-heptadiene-3,5-dione, 1-(3,5-dimethyl-4-hydroxyphenyl)-7-(3-methoxy-4-hydroxyphenyl)-1,6-heptadiene-3,5-dione, 1,7-bis(3-methyl-4-hydroxyphenyl)-1,6-heptadiene-3,5-dione, Methyl Violet 2B (CI No. 42555), Malachite Green (CI No. 42000), Victoria Blue B (CI No. 44045), Neutral Red (CI No. 50040), Solvent Yellow 2 (CI No. 11020), Solvent Yellow 6 (CI No. 11390), Solvent Yellow 14 (CI No. 12055), Solvent Yellow 15 (CI No. 18820), Solvent Yellow 16 (CI No. 12700), Solvent Yellow 21 (CI No. 18690), Solvent Yellow D-33 (CI No. 47000), Solvent Yellow 56 (CI No. 11021), Solvent Orange 1 (CI No. 11920), Solvent Orange 2 (CI No. 12100), Solvent Orange 14 (CI No. 26020), Solvent Red 3 (CI No. 12010), Solvent Red 8 (CI No. 12715), Solvent Red 23 (CI No. 26100), Solvent Red 24 (CI No. 26105), Solvent Red 25 (CI No. 26110), Solvent Red 27 (CI No. 26125), Solvent Red (CI No. 45170B), Disperse Red 9 (CI No. 60505), Oil Scarlet 308 (CI No. 21260), Solvent Brown (CI No. 12020), Disperse Yellow 1 (CI No. 10345), Disperse Yellow 3 (CI No. 11855), Disperse Yellow 4 (CI No. 12770), Disperse Yellow 8 (CI No. 27090), Disperse Yellow 42 (CI No. 10338), Disperse Orange 1 (CI No. 11080), Disperse Orange 3 (CI No. 11005), Disperse Orange 5 (CI No. 11100), Disperse Orange 11 (CI No.

60700), Disperse Red 1 (CI No. 11110), Disperse Red 4 (CI No. 60755), Disperse Red 11 (CI No. 62015), Disperse Red 15 (CI No. 60710), and Disperse Red 58 (CI No. 11135); methine-type dyes, such as Miketon Fast Yellow 7G and Miketon Fast Orange 5R (trademarks, manufactured by Mitusi Toatsu Chemical), Horon (trademarks, manufactured by Sando Pharmaceutical), and Macrolex Yellow 6G (trademark, manufactured by Bayer); pyrazol-type or imidazole-type dyes, such as Yello HM-1123 and Yellow HM-1134 (trademarks, manufactured by Mitusi Toatsu Chemical), 5-methyl-1-phenyl-4-phenylazopyrazol, 1-phenyl-4-phenylazo-5-methylimidazole, 1-phenyl-4-phenylazo-5-oxypyrazol, and 1-phenyl-4-phenylazo-5-oxyimidazole; fluorescent whiteners, such as bicucine derivatives, norbicucine, stilbene, 4,4-diaminostilbene derivatives, cumarin derivatives, and pyrazolin derivatives; and UV absorbers, such as hydroxy azo-type dyes, Tinuvin 234 and Tinuvin 1130 (trademarks, manufactured by Ciba Geigy).

The amount of these radiation absorbers to be incorporated is usually 100 parts by weight or smaller, preferably 50 parts by weight or smaller, for 100 parts by weight of solid components of the reflection preventing film.

Beside the above-mentioned additives, storage stabilizers, defoaming agents, and adhesion promoters may be incorporated as other additives.

Illustrating now the process for forming resist patterns of the present invention, the reflection preventing film composition comprising the copolymers and additives, if necessary, is first coated on a substrate, such as a silicon-wafer to make the reflection preventing film with a prescribed thickness of, for example, 500–50,000 angstrom. In this instance, a solution of the above composition is prepared by dissolving a prescribed amount of the copolymers and the additives, if necessary, in a solvent to make a solid component concentration of, for example, 5–20% by weight, and filtering through a filter with a pore size of, for example, 0.2 μm. This solution is applied to the substrate by roll-coating, flow-coating, spin-coating, or the like. The reflection preventing film is cured by baking to make it insoluble in a solvent of the resist solution. A baking temperature of, for example, 90°–250° C. is applied.

The solvent used in preparing the solution of the reflection preventing film composition may be any solvents which can dissolve the copolymers and additives, and is appropriately selected from, for example, 2-methoxyethyl acetate, 2-ethoxyethyl acetate, ethylene glycol monomethyl ether, ethylene glycol monoethyl ether, propylene glycol methyl ether acetate, propylene glycol ethyl ether acetate, propylene glycol propyl ether acetate, methyl ethyl ketone, cyclohexanone, dioxane, tetrahydrofuran, methyl 2-hydroxypropionate, ethyl 2-hydroxypropionate, ethyl 2-hydroxy-2-methylpropionate, ethyl ethoxyacetate, ethyl oxyacetate, methyl 2-hydroxy-3-methylbutyrate, 3-methyl-3-methoxybutyl acetate, 3-methyl-3-methoxybutyl propionate, 3-methyl-3-methoxybutyl butyrate, diglyme, ethyl acetate, butyl acetate, methyl 3-methoxypropionate, ethyl pyruvate, toluene, xylene, cyclohexane, and the like.

These solvents can be used either alone or as a mixture of two or more.

If desired, a high boiling point solvent may be added to these solvents. Such a high boiling point solvent may be benzyl ethyl ether, dihexyl ether, diethylene glycol monomethyl ether, diethylene glycol monoethyl ether, diethylene glycol monopropyl ether, diethylene glycol monobutyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, N-methylpyrrolidone, or the like.

After forming the reflection preventing film on the substrate, a resist is coated on the reflection preventing film to form a coating film with a prescribed thickness. Then, the resist coating film is prebaked to remove the solvent contained therein. The prebaking temperature is usually about 30°–200° C., preferably 50°–150° C., although it is suitably adjusted depending on the types of resist used.

In forming the resist coating film, a solution of the resist is prepared by dissolving the resist in a suitable solvent to make a solid component concentration of, for example, 5–50% by weight, and filtering it through a filter with a pore size of, for example, 0.2 μm. This solution is applied to the reflection preventing film on the substrate, such as a silicon-wafer or a wafer covered with aluminum, for example, by roll-coating, flow-coating, spin-coating, or the like. Needless to mention, commercially available resist solution can be used as they are in this instance.

Beside positive resists consisting of a novolak resin and a quinonediazide compound as a radiation sensitive agent, for example, negative resists comprising an alkali-soluble resin and a radiation sensitive crosslinking agent, or a chemically amplified resists comprising a photo-acid generator can be used as a resist for forming the resist pattern of the present invention.

Then, the resist coating film is irradiated by radiation, such as visible rays, ultraviolet rays, deep ultraviolet rays, X rays, electron beam, γ-rays, molecular beam, ion beam, or the like, and then developed, washed, and dried to form a desired pattern. In this process, baking may be performed after irradiation (post-exposure bake) in order to promote the resolution, pattern profile, developability, and the like. Finally, dry etching of the reflection preventing film is performed by masking the resist pattern using a gas plasma, e.g. oxygen plasma, to obtain a resist pattern for a substrate working.

An aqueous alkaline solution in which an alkaline compound is dissolved is used as the developer for forming the resist pattern in the process of the present invention. Given as examples of alkaline compounds which can be used here are sodium hydroxide, potassium hydroxide, sodium carbonate, sodium silicate, sodium methasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrole, piperidine, choline, 1,8-diazabicyclo-[5.4.0]-7-undecene, and 1,5-diazabicyclo-[4.3.0]-5-nonene.

Further, suitable amounts of water-soluble organic solvents, such as alcohol (e.g. methanol, ethanol), and surfactants may be added to the developer.

Other features of the invention will become apparent in the course of the following description of the exemplary embodiments which are given for illustration of the invention and are not intended to be limiting thereof.

EXAMPLES

The resists used in the Examples and Comparative Examples are as follows.
Kind of resist
Resist A:
A positive resist comprising of a novolak resin and a naphthoquinone-diazide-5-sulfonate as a radiation sensitive agent (trademark: PFR IX120, manufactured by Japan Synthetic Rubber).

Resist B:

A chemically amplified positive resist. A solution obtained by dissolving 100 parts by weight of polyhydroxystyrene with 50% of hydroxy group being tert-butoxycarbonylized (Mw=10,000), 2 parts by weight of triphenylsulfonium hexafluoroantimonate (a photo-acid generator) in 306 parts by weight of propylene glycol methyl ether acetate, and then filtering the solution through a membrane filter having a pore size of 0.2 μm.

Formation of resist patterns and the evaluation of performances of reflection preventing films were carried out as follows.

Formation of resist pattern

A reflection preventing film with a thickness of 0.2 μm was formed by spin-coating the reflection preventing film composition on a silicon wafer (diameter: 4") with 0.2 μm of aluminum layer by spattering, and then baking for 2 minutes on a hot plate at 170° C. A resist coating film with a thickness of 1.5 μm was then formed on the reflection preventing film by spin-coating a resist solution. The resist coating film was baked for 2 minutes on a hot plate at 90° C. Then, the resist coating film was irradiated for a period of time required for a 0.6 μm line-and-space pattern to be formed at 1:1 line width (hereinafter referred to as optimum exposure time), using Stepper NSR1505i6A manufactured by Nikon (numerical aperture: 0.45, wavelength: 365 nm) for resist A, or using Stepper NSR1505EX manufactured by Nikon (numerical aperture: 0.42, wavelength: 248 nm) for resist B. Then, post-exposure-baking was carried out on a hot plate at 110° C. for one minute, followed by development using a 2.38 wt % aqueous solution of tetramethylammonium hydroxide at 25° C. for one minute, washing, and drying, thus forming a resist pattern.

Evaluation of performances of reflection preventing film (1) Halation preventing effect A reflection preventing film with a thickness of 0.2 μm was produced by spin-coating the reflection preventing film composition on an aluminum substrate having a hole pattern (depth: 0.6 μm, diameter: 2 μm), and baked for 2 minutes on a hot plate at 170° C. A resist coating film was formed on the reflection preventing film by spin-coating a resist solution in the same manner as the above-mentioned resist pattern. The center of the hole pattern was irradiated for the optimum exposure time to form a line pattern with 1 μm width. The notching depth due to halation produced during the optimum exposure time was measured. The halation preventing effect was evaluated by the percentage of the notching depth in the 1 μm width line pattern, and judged as good when the percentage was less than 10%, as fair when it was 10–20%, and as bad when it was greater than 20%.

(2) Sublimation

A reflection preventing film was formed by spin-coating the reflection preventing film composition on a quartz substrate, and baked for one minute on a hot plate at 150° C., absorbance (A) at maximum absorption (max) at wavelengths of 300 nm and greater was measured using an auto-spectrophotometer U-3210 (trademark, manufactured by Hitachi, Ltd.). The film was then baked for five minutes on a hot plate at 180° C., and the maximum absorption (max) was again measured (absorbance (B)). The rate of sublimation, (A-B)×100/A, was calculated, and judged as good when the value was 3% or less and as bad when it was more than 3%.

(3) Intermixing (resolution)

The reflection preventing film and resist coating film were formed in the same manner as they were formed in the evaluation of the halation preventing effect (1). Pre-baking, irradiation, and development were carried out, to measure the minimum size of the developed resist pattern using a scanning electron microscope.

(4) Intermixing (developability)

The reflection preventing film and resist coating film were formed in the same manner as they were formed in the evaluation of the halation preventing effect (1). Pre-baking, irradiation, and development were carried out, to examine production of scum due to residues of the reflection preventing film or the resist coating film and the degree of undevelopment by a scanning electron microscope.

(5) Heat resistance

In the same manner as forming a resist pattern on the reflection preventing film, post-exposure-baking was carried out for two minutes on a hot plate at 140° C. instead of 110° C. Then, the degree of pattern deformation was examined.

(6) Dry etching performance

The reflection preventing film and resist coating film were formed in the same manner as they were formed in the evaluation of the resist pattern. The films were subjected to dry etching by oxygen plasma (pressure: 15 Pa, RF power: 300 W, etching gas: oxygen) using a dry etching device DEM-451 (trademark, manufactured by Nichiden Anerba), to measure and determine the ratio (P) of dry etching rate of the reflection preventing film and that of the resist film, according to the following formula, $$P=Ra/Rr$$

wherein Ra is the dry etching rate of the reflection preventing film and Rr is the dry etching rate of the resist coating film.

The dry etching performance was rated as good when P is larger than 1.5, as fair when P was 0.9–1.5, and as bad when P was smaller than 0.9.

(7) Storage stability

Viscosity (C) of a solution of the reflection preventing film composition at 25° C. was measured immediately after preparation using an E-type viscometer (manufactured by Tokyo Keiki). After storing this solution at room temperature for 3 months, viscosity (D) was measured in the same manner. The storage stability, (D-C)×100/C, was calculated, and judged as good when the value was smaller than 2%, as fair when it was 2–5%, and as bad when it was more than 5%.

The composition of reflection preventing films used in the Examples hereinafter were prepared according to the following Synthesis Examples, wherein "parts" and "%" designate parts by weight and % by weight, respectively.

Synthesis Example 1

10 parts of methacrylic acid, 20 parts of glycidyl methacrylate, 40 parts of 4'-(3-methyl-4-methoxycinnamoyl)phenyl acrylate, 350 parts of methyl 3-methoxypropionate, and 4 parts of azobisisobutyronitrile were charged in a separable flask equipped with a stirrer, a thermometer, and a cooling tube. After bubbling nitrogen gas for 15 minutes, the reaction temperature was raised to 80° C. and the mixture was polymerized for 4 hours. The reaction mixture comprising a copolymer was cooled to 25° C. to obtain a reflection preventing film composition (A). The copolymerization ratio of methacrylic acid:glycidyl methacrylate:4'-(3-methyl-4-methoxycinnamoyl)-phenyl acrylate in the copolymer of composition (A) was 10:20:37 by weight as determined by $^1$H-NMR and $^{13}$C-NMR.

Synthesis Example 2

10 parts of methacrylic acid, 20 parts of glycidyl methacrylate, 35 parts of 4'-(4-methoxy-α-cyanocinnamoyl)phenyl acrylate, 350 parts of methyl 3-methoxypropionate, and 4 parts of azobisisobutyronitrile were charged in a separable flask equipped with a stirrer, a thermometer, and a cooling tube. After bubbling nitrogen gas for 15 minutes, the reaction temperature was raised to 80° C. and the mixture was polymerized for 4 hours. The reaction mixture comprising a copolymer was cooled to 25° C. to obtain a reflection preventing film composition (B). The copolymerization ratio of methacrylic acid:glycidyl methacrylate:4'-(4-methoxy-α-cyanocinnamoyl)-phenyl acrylate in the copolymer of composition (B) was 10:20:32 by weight as determined by $^1$H-NMR and $^{13}$C-NMR.

Synthesis Example 3

10 parts of acrylic acid, 20 parts of glycidyl acrylate, 40 parts of 4'-(4-methylcinnamoyl)phenyl acrylate, 25 parts of cyclohexyl methacrylate, 350 parts of methyl 3-methoxypropionate, and 4 parts of azobisisobutyronitrile were charged in a separable flask equipped with a stirrer, a thermometer, and a cooling tube. After bubbling nitrogen gas for 15 minutes, the reaction temperature was raised to 80° C. and the mixture was polymerized for 4 hours. The reaction mixture comprising a copolymer was cooled to 25° C. to obtain a reflection preventing film composition (C). The copolymerization ratio of acrylic acid:glycidyl acrylate:4'-(4-methylcinnamoyl)phenyl acrylate:cyclohexyl methacrylate in the copolymer of composition (C) was 10:20:38:24 by weight as determined by $^1$H-NMR and $^{13}$C-NMR.

Synthesis Example 4

10 parts of methacrylic acid, 20 parts of glycidyl methacrylate, 40 parts of 4'-(4-methylcinnamoyl)phenyl acrylate, 25 parts of n-hexyl methacrylate, 350 parts of methyl 3-methoxypropionate, and 4 parts of azobisisobutyronitrile were charged in a separable flask equipped with a stirrer, a thermometer, and a cooling tube. After bubbling nitrogen gas for 15 minutes, the reaction temperature was raised to 80° C. and the mixture was polymerized for 4 hours. The reaction mixture comprising a copolymer was cooled to 25° C. to obtain a reflection preventing film composition (D). The copolymerization ratio of methacrylic acid:glycidyl methacrylate:4'-(4-methylcinnamoyl)-phenyl acrylate:n-hexyl methacrylate in the copolymer of composition (D) was 10:20:37:23 by weight as determined by 1H-NMR and $^{13}$C-NMR.

Synthesis Example 5

10 parts of methacrylic acid, 20 parts of glycidyl methacrylate, 40 parts of 4'-(4-methylcinnamoyl)phenyl methacrylate, 30 parts of dicyclopentadienyl methacrylate, 350 parts of methyl 3-methoxypropionate, and 4 parts of azobisisobutyronitrile were charged in a separable flask equipped with a stirrer, a thermometer, and a cooling tube. After bubbling nitrogen gas for 15 minutes, the reaction temperature was raised to 80° C. and the mixture was polymerized for 4 hours. The reaction mixture comprising a copolymer was cooled to 25° C. to obtain a reflection preventing film composition (E). The copolymerization ratio of methacrylic acid:glycidyl methacrylate:4'-(4-methylcinnamoyl)phenyl methacrylate:dicyclopentadienyl methacrylate in the copolymer of composition (E) was 10:20:37:29 by weight as determined by $^1$H-NMR and $^{13}$C-NMR.

Synthesis Example 6

10 parts of methacrylic acid, 20 parts by weight of glycidyl methacrylate, 40 parts of 4'-(4-methoxycinnamoyl)phenyl methacrylate, 30 parts by weight of tert-butyl methacrylate, 350 parts of methyl 3-methoxypropionate, and 4 parts of azobisisobutyronitrile were charged in a separable flask equipped with a stirrer, a thermometer, and a cooling tube. After bubbling nitrogen gas for 15 minutes, the reaction temperature was raised to 80° C. and the mixture was polymerized for 4 hours. The reaction mixture comprising a copolymer was cooled to 25° C. to obtain a reflection preventing film composition (F). The copolymerization ratio of methacrylic acid: glycidyl methacrylate:4'-(4-methoxycinnamoyl)phenyl acrylate:tert-butyl methacrylate in the copolymer of composition (F) was 10:20:39:30 by weight as determined by $^1$H-NMR and $^{13}$C-NMR.

Synthesis Example 7

10 parts of methacrylic acid, 20 parts by weight of glycidyl methacrylate, 60 parts of 4'-(4-methoxycinnamoyl)phenyl methacrylate, 10 parts by weight of tert-butyl methacrylate, 350 parts of methyl 3-methoxypropionate, and 4 parts of azobisisobutyronitrile were charged in a separable flask equipped with a stirrer, a thermometer, and a cooling tube. After bubbling nitrogen gas for 15 minutes, the reaction temperature was raised to 80° C. and the mixture was polymerized for 4 hours. The reaction mixture comprising a copolymer was cooled to 25° C. to obtain a reflection preventing film composition (G). The copolymerization ratio of methacrylic acid: glycidyl methacrylate:4'-(4-methoxycinnamoyl)phenyl acrylate:tert-butyl methacrylate in the copolymer of composition (G) was 10:20:78:10 by weight as determined by $^1$H-NMR and $^{13}$C-NMR.

Synthesis Example 8

10 parts of methacrylic acid, 20 parts by weight of glycidyl methacrylate, 60 parts of 4'-(4-methoxycinnamoyl)phenyl methacrylate, 10 parts by weight of tricyclodecanyl methacrylate, 350 parts of methyl 3-methoxypropionate, and 4 parts of azobisisobutyronitrile were charged in a separable flask equipped with a stirrer, a thermometer, and a cooling tube. After bubbling nitrogen gas for 15 minutes, the reaction temperature was raised to 80° C. and the mixture was polymerized for 4 hours. The reaction mixture comprising a copolymer was cooled to 25° C. to obtain a reflection preventing film composition (H). The copolymerization ratio of methacrylic acid:glycidyl methacrylate:4'-(4-methoxycinnamoyl)phenyl acrylate:tricyclodecanyl methacrylate in the copolymer of composition (H) was 10:20:78:10 by weight as determined by $^1$H-NMR and 13C-NMR.

Synthesis Example 9

40 parts of glycidyl methacrylate, 40 parts of 4'-(3-methyl-4-methoxycinnamoyl)phenyl acrylate, 350 parts of methyl 3-methoxypropionate, and 4 parts of azobisisobutyronitrile were charged in a separable flask equipped with a stirrer, a thermometer, and a cooling tube. After bubbling nitrogen gas for 15 minutes, the reaction temperature was raised to 80° C. and the mixture was polymerized for 4 hours. The reaction mixture comprising a copolymer was cooled to 25° C. to obtain a reflection preventing film composition (I). The copolymerization ratio of glycidyl methacrylate:4'-(3-methyl-4-methoxycinnamoyl)phenyl acrylate in the copolymer of composition (I) was 40:35 by weight as determined by $^1$H-NMR and $^{13}$C-NMR.

EXAMPLES 1–16

Each reflection preventing film composition obtained in Synthesis Examples was diluted with methyl 3-methoxypropionate to make a homogeneous solution containing 10% of solid components. The solutions thus obtained were filtered through a membrane filter with a pore size of 0.2 μm to prepare solutions of the reflection preventing film composition. Resist patterns were prepared using these solutions and performance evaluations of the reflection preventing films were carried out by the above-described methods. Results are shown in Tables 1 and 2.

Comparative Examples 1–5

Resist patterns were prepared using reflection preventing films shown in Table 1 or using the solution prepared in the same manner as in Examples 1–16 from reflection preventing film (I) obtained in Synthesis Example 9, and performance evaluations of the reflection preventing films were carried out by the above-described methods. Results are shown in Tables 1 and 2.

manufacture of integrated circuits with a higher degree of integration.

Obviously, numerous modifications and variations of the present invention are possible in light of the above teachings. It is therefore to be understood that within the scope of the appended claims, the invention may be practiced otherwise than as specifically described herein.

What is claimed is:

1. A reflection preventing film which comprises a copolymer comprising,

TABLE 1

|  | Examples |  |  |  |  |  |  |  | Comparative Examples |  |  |
|---|---|---|---|---|---|---|---|---|---|---|---|
|  | 1 | 2 | 3 | 4 | 5 | 6 | 7 | 8 | 1 | 2 | 3 |
| Reflection preventing film | A | B | C | D | E | F | G | H | — | (*1) | (*2) |
| Resist | A | A | A | A | A | A | A | A | A | A | A |
| Halation preventing effect | Good | Fair | Good | Good | Good | Good | Good | Good | Bad | Fair | Fair |
| Sublimation | Good | Good | Good | Good | Good | Good | Good | Good | — | Bad | Bad |
| Intermixing |  |  |  |  |  |  |  |  |  |  |  |
| Resolution (μm) | 0.38 | 0.39 | 0.38 | 0.39 | 0.38 | 0.38 | 0.38 | 0.38 | 0.40 | 0.42 | 0.40 |
| Developability | Good | Good | Good | Good | Good | Good | Good | Good | Good | Scum produced | Scum produced |
| Heat resistance | Good | Good | Good | Good | Good | Good | Good | Good | Good | Bad | Good |
| Dry etching performance | Good | Good | Good | Good | Good | Good | Fair | Fair | — | Good | Bad |
| Storage stability | Fair | Fair | Good | Good | Good | Good | Good | Good | — | Fair | Fair |

(*1) Prepared from a solution of a 8:1 (by weight) mixture of poly(butene sulfone) and Cumarin 504 (trademark, manufactured by Exiton Co.) in cyclopentanone.
(*2) Prepared from a solution of a 10:8:1:1 (by weight) mixture of poly(amic acid) (dianhydride of oxydianilin/pyromellitic acid), curcumin, bicucine, and Sudan orange G dissolved in a 2:1 (by weight) solvent of cyclohexanone and N-methyl-2-pyrrolidone. Baking conditions using this reflection preventing film composition were 200° C. for 10 minutes, excepting the sublimation test.

TABLE 2

|  | Examples |  |  |  |  |  |  |  | Comparative Examples |  |
|---|---|---|---|---|---|---|---|---|---|---|
|  | 9 | 10 | 11 | 12 | 13 | 14 | 15 | 16 | 4 | 5 |
| Reflection preventing film | A | B | C | D | E | F | G | H | — | F |
| Resist | B | B | B | B | B | B | B | B | B | B |
| Halation preventing effect | Good | Fair | Good | Good | Good | Good | Good | Good | Bad | — |
| Sublimation | Good | Good | Good | Good | Good | Good | Good | Good | — | Good |
| Intermixing |  |  |  |  |  |  |  |  |  |  |
| Resolution (μm) | 0.32 | 0.33 | 0.32 | 0.32 | 0.32 | 0.32 | 0.32 | 0.32 | 0.34 | 0.55 |
| Developability | Good | Good | Good | Good | Good | Good | Good | Good | Good | Scum with undeveloped portion |
| Heat resistance | Good | Good | Good | Good | Good | Good | Good | Good | Good | Good |
| Dry etching performance | Good | Good | Good | Good | Good | Good | Fair | Fair | — | — |
| Storage stability | Fair | Fair | Good | Good | Good | Good | Good | Good | — | — |

As illustrated above, the reflection preventing film of the present invention exhibits a high halation preventing effect, involves no sublimation of radiation absorbing components contained therein, is free from occurrence of intermixing, possesses excellent heat resistance, exhibits a superb dry etching performance and storage stability, and produces resist patterns with excellent resolution and precision. The reflection preventing film and the process for forming resist patterns can, therefore, greatly contribute especially to the at least one recurring unit of the following formula (1),

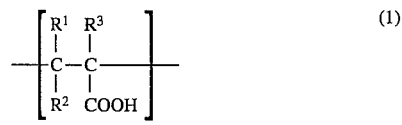

$R^1$, $R^2$, and $R^3$ may be the same or different and individually represent a hydrogen atom or an organic group;

at least one recurring unit of the following formula (2),

wherein $R^1$, $R^2$, and $R^3$ may be the same or different and individually represent a hydrogen atom or an organic group, and $R^4$ is an organic group containing an epoxy group; and at least one recurring unit of the following formula (3),

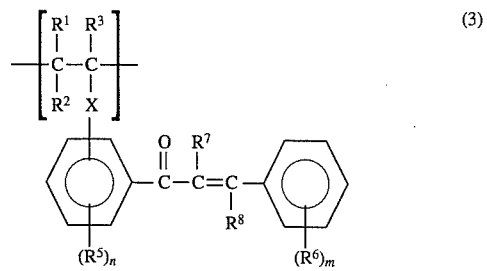

wherein $R^1$, $R^2$, and $R^3$ may be the same or different and individually represent a hydrogen atom or an organic group, X represents a divalent group or a single bond, $R^5$ and $R^6$ may be the same or different and individually represent a hydrogen atom, a halogen atom, a hydroxy group, an amino group, a nitro group, or an organic group, $R^7$ and $R^8$ may be the same or different and individually represent a hydrogen atom, a halogen atom, an amino group, or an organic group, n is an integer of 1–4, and m is an integer of 1–5.

2. The reflection preventing film according to claim 1, wherein the organic group represented by $R^1$, $R^2$, or $R^3$ is selected from alkyl groups, carboxyl group, carboxyl alkyl groups, alkoxycarbonyl groups, acyloxy groups, aryl groups, aralkyl groups, alkoxy groups, cyclic alkyl groups, cyano groups, and amide groups; the epoxy group-containing organic group represented by $R^4$ is selected from epoxy group-containing alkyl groups, epoxy group-containing ether groups consisting of said epoxy group-containing alkyl group bonded to a carbon atom in the main chain constructing said recurring unit of said formula (2) via —O— or —OR$^9$—, wherein $R^9$ is an alkylene group, and epoxy group-containing ester groups consisting of said epoxy group-containing alkyl group bonded to a carbon atom in the main chain constructing said recurring unit of said formula (2) via —COO— or —COOR$^9$—, wherein $R^9$ is an alkylene group; the divalent group represented by X is a group —COO—, —COOR$^9$—, —O—, or —OR$^9$—, wherein $R^9$ is an alkylene group; the organic group represented by $R^5$ or $R^6$ is selected from alkyl groups, carboxyl group, carboxyl alkyl groups, alkoxycarbonyl groups, acyloxy groups, aryl groups, aralkyl groups, alkoxy groups, cyclic alkyl groups, cyano groups, amide groups, alkenyl groups, and cyclic alkyloxy groups; the organic group represented by $R^7$ or $R^8$ is selected from alkyl groups, carboxyl group, carboxyl alkyl groups, alkoxycarbonyl groups, acyloxy groups, aryl groups, aralkyl groups, alkoxy groups, cyclic alkyl groups, cyano groups, and amide groups.

3. The reflection preventing film according to claim 1, wherein said copolymer comprises copolymerized monomers corresponding to the recurring units represented by said formulas (1), (2), and (3) at a proportion of 2–50:5–60:2–60 mol %.

4. The reflection preventing film according to claim 1, wherein said copolymer comprises copolymerized monomers corresponding to the recurring units represented by said formulas (1), (2), and (3) at a proportion of 5–45:10–50:5–50 mol %.

5. The reflection preventing film according to claim 1, wherein said copolymer comprises copolymerized monomers corresponding to the recurring units represented by said formulas (1), (2), and (3) at a proportion of 10–40:15–45:10–45 mol %.

6. The reflection preventing film according to claim 3, wherein said copolymer further comprises one or more copolymerized monomers with a bulky group.

7. The reflection preventing film according to claim 6, wherein said monomer with a bulky group is selected from the group consisting of styrene, α-methylstyrene, 4-methylstyrene, 2-hydroxystyrene, 4-hydroxystyrene, 4-t-butylstyrene, chloromethylstyrene, divinylbenzene, dimethylvinylstyrylsilane, isopropenylstyrene, 1-vinylnaphthalene, 2-vinylnaphthalene, 9-vinylanthracene, 9-vinylcarbazole, vinylcyclohexene, ethylidenenorbornene, cyclopentadiene, tert-butyl (meth)acrylate, cyclohexyl (meth)acrylate, adamantyl (meth)acrylate, 1-naphthyl (meth)acrylate, 2-naphthyl (meth)acrylate, dicyclopentanyl (meth)acrylate, tricyclodecenyl (meth)acrylate, tricyclodecenyloxyethyl (meth)acrylate, tricyclodecanyl (meth)acrylate, 2-methacryloyloxyethyl phthalate, and 2-methacryloyloxyethyl hexahydrophthalate.

8. The reflection preventing film according to claim 3, wherein said copolymer further comprises one or more copolymerized monomers selected from the group consisting of vinyl esters of carboxylic acid, cyanated vinyl compounds, esters of unsaturated carboxylic acid, olefins, halogenated olefins, dienes, unsaturated group-containing unsaturated carboxylic acid esters, halogen-containing vinyl compounds, hydroxy group-containing vinyl compounds, amide group-containing vinyl compounds, and carboxyl group-containing vinyl compounds.

9. A process for forming a resist pattern which comprises forming the reflection preventing film defined in claim 1 on a substrate, coating a resist on said reflection preventing film to form a resist coating film, irradiating the resist coating film with a radiation in a desired pattern form, and developing the resist coating film to form a resist pattern.

10. The process according to claim 9, wherein said reflection preventing film is formed by a process comprising: preparing a solution by dissolving the copolymer defined in claim 1 in a solvent to make a solid component concentration of 5–50% by weight, filtering this solution through a filter, applying the filtrate to a substrate to form a film and baking the film to cure it.

* * * * *